(12) United States Patent
Barker et al.

(10) Patent No.: US 8,216,364 B1
(45) Date of Patent: Jul. 10, 2012

(54) SYSTEM AND METHOD FOR LOW-POWER NANOTUBE GROWTH USING DIRECT RESISTIVE HEATING

(75) Inventors: Delmar L. Barker, Tucson, AZ (US); Mead M. Jordan, Tucson, AZ (US); William R. Owens, Tucson, AZ (US)

(73) Assignee: Raytheon Company, Waltham, MA (US)

( * ) Notice: Subject to any disclaimer, the term of this patent is extended or adjusted under 35 U.S.C. 154(b) by 1059 days.

(21) Appl. No.: 12/102,302

(22) Filed: Apr. 14, 2008

(51) Int. Cl.
*C30B 25/22* (2006.01)

(52) U.S. Cl. ............... 117/87; 117/84; 117/85; 117/86; 117/88; 117/103; 117/104; 117/106; 117/200; 117/204; 117/205; 977/720; 977/721; 977/722; 977/734; 977/742; 977/743; 977/750; 977/751; 977/752; 977/813; 977/814; 977/822

(58) Field of Classification Search ............. 117/84–88, 117/94–95, 97, 102–104, 106, 108, 200–202, 117/204–205, 921, 929; 977/700, 720–723, 977/734, 742–743, 750–752, 778–782, 813–814, 977/822

See application file for complete search history.

(56) References Cited

U.S. PATENT DOCUMENTS

2010/0327247 A1* 12/2010 Ward et al. ............... 257/2
2011/0033639 A1* 2/2011 Coll et al. ............... 427/585

FOREIGN PATENT DOCUMENTS

WO 2007009112 A2 1/2007

OTHER PUBLICATIONS

B. Wei, et al. publication entitled "Lift-up growth of aligned carbon nanotube patterns," Appl. Phys. Lett., vol. 77, pp. 2985-2987 (2000).*
Daenen et al., The wonderous world of carbon nanotubes, Eindhoven University of Technology, Feb. 27, 2003, pp. 1-23.
Striemer et al., Charge- and size-based separation of macromolecules using ultrathin silicon memranes, 2007 Nature Publishing Group, pp. 749-753.
Wang et al., Catalytic synthesis of carbon nanotubes under ion irradiation, Letters to the Editors, Carbon 43 (2005) 447-450.
Babonneau et al., Morphology of encapsulated iron nanoparticles obtained by co-sputtering and implantation: a GISAXS study, J. Appl. Cryst. (2000) 33, 437-441.
Adhikari et al., Ion-implantation-prepared catalyst nanoparticles for growth of carbon nanotubes, Applied Physics Letters 86, 053104 (2005), pp. 86-88.

(Continued)

*Primary Examiner* — Michael Kornakov
*Assistant Examiner* — Kenneth A Bratland, Jr.
(74) *Attorney, Agent, or Firm* — Eric A. Gifford

(57) ABSTRACT

Direct resistive heating is used to grow nanotubes out of carbon and other materials. A growth-initiated array of nanotubes is provided using a CVD or ion implantation process. These processes use indirect heating to heat the catalysts to initiate growth. Once growth is initiated, an electrical source is connected between the substrate and a plate above the nanotubes to source electrical current through and resistively heat the nanotubes and their catalysts. A material source supplies the heated catalysts with carbon or another material to continue growth of the array of nanotubes. Once direct heating has commenced, the source of indirect heating can be removed or at least reduced. Because direct resistive heating is more efficient than indirect heating the total power consumption is reduced significantly.

30 Claims, 13 Drawing Sheets

OTHER PUBLICATIONS

Kotakoski et al., B and N implantation into carbon nanotubes: Insight from atomistic simulations, Physical Review B 71, (2005), 205408-1-205408-6.

Rodriguez-Manzo et al., In situ nucleation of carbon nanotubes by the injection of carbon atoms into metal particles, Nature Nanotechnology, vol. 2, (May 2007)307-311.

P.M. Ajayan, Nanotubes from carbon, 1999 American Chemical Society, May 1, 1999, pp. 1787-1799.

Yamamoto et al., New method of carbon nanotube growth by ion beam irradiation, Appl. Phys. Lett., vol. 69, (1996), 4174-4175.

Kaukonen et al., Atomic-scale modeling of the ion-beam-induced growth of amorphous carbon, Phys. Rev. B, vol. 61 (2000), 2806-2811.

Tanemura et al., Synthesis of carbon nanotubes using hydrocarbon ion beams, Advanced Materials Research, vol. 11-12 (2006), 547.

Tanemura et al., Direct growth of single carbon nanofiber onto tip of scanning probe microscopy induced by ion irradiation, Japanese J. of Appl. Phys. vol. 45, No. 3, 2004-2008.

Kenji Hata, From highly efficient impurity-free CNT synthesis to DWNT forests, CNTsolids and super-capacitors, Research for Advanced Carbon Materials, Japan, SPIE, vol. 6479, (2007).

Vinciguerra et al., Growth mechanisms in chemical vapour deposited carbon nanotubes, Nanotechnology, vol. 14 (2003) pp. 655-660.

Liu et al., Effects of interfacial layers on thermal chemical vapour deposition of carbon nanotubes using iron catalyst, Diamond & Related Materials 14 (2005), pp. 835-840.

Tselev et al., A photolithographic process for fabrication of devices with isolated single-walled carbon nanotubes, Nanotechnology 15 (2004), pp. 1475-1478.

Zhang et al., Imaging as-grown single-walled carbon nanotubes originated from isolated catalytic nanoparticles, Appl. Phys. A 74, Mar. 4, 2002, pp. 325-328.

Bingqing Wei et al. "Lift-up growth of aligned carbon nanotube patterns" Applied Physics Letters vol. 77, No. 19, Nov. 6, 2000, pp. 2985-2987.

Zexiang Chen et al. "Sandwich growth of carbon nanotubes", Diamond & Related Materials 15 (2006) 104-108.

Richard Smalley et al. "Single Wall Carbon Nanotube Amplification: En Route to a type-specific growth mechanism" J. Am Chem. Soc. Articles, published on web Nov. 15, 2006.

Wei Wei et al "Tip cooling effect and failure mechanism of Field-Emitting Carbon Nanotubes" Nano Letters 2007, vol. 7, No. 1, 64-68.

Croci M. et al., "Cold atmosphere CVD: a simple method for the growth of carbon nanotubes," Chemical Vapor Deposition, Wiley-VCH Verlag, Weinheim, DE, vol. 8, No. 3, May 1, 2002, pp. 89-92.

Dittmer S et al., "Low ambient temperature CCD growth of carbon nanotubes," Applied Physics A; Materials Science & Processing, Springer, Berlin, vol. 84., No. 3, May 17, 2006, pp. 243-246.

Chen Z et al., "Sandwich growth of carbon nanotubes," Diamond and Related Materials, Elsevier Science Publishers, Amsterdam, NL, vol. 15, No. 1, Jan. 1, 2006, pp. 104-108.

Wei B et al., "Lift-up growth of aligned carbon nanotube patterns," Applied Physics Letters, AIP, American Institute of Physics, Melville, NY, vol. 77, No. 19, Nov. 6, 2000, pp. 2985-2987.

* cited by examiner

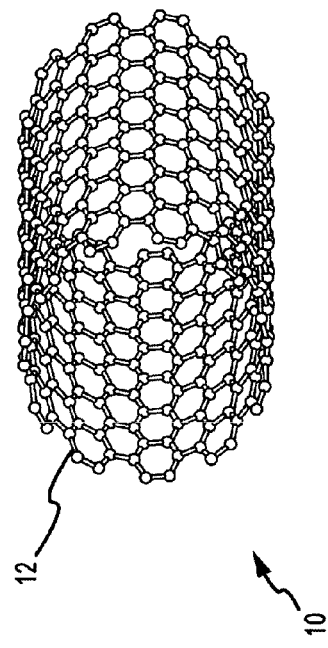
FIG. 1
(PRIOR ART)
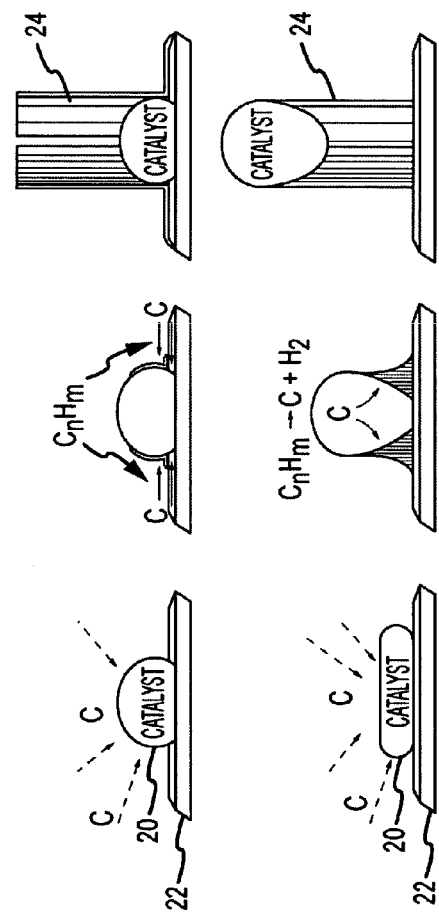
FIG. 2a
(PRIOR ART)
FIG. 2b
(PRIOR ART)

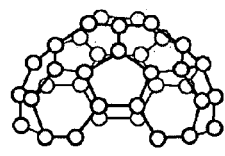
FIG. 6a
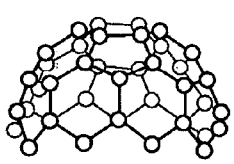
FIG. 6b
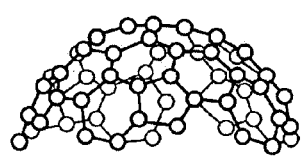
FIG. 6c
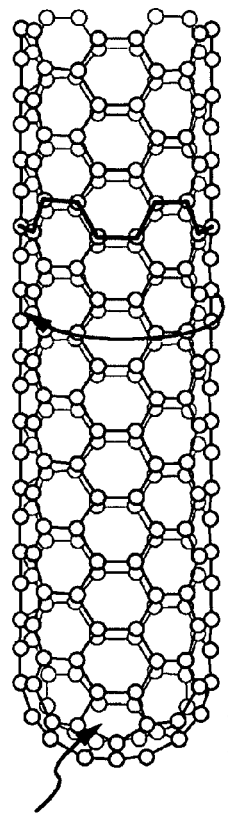
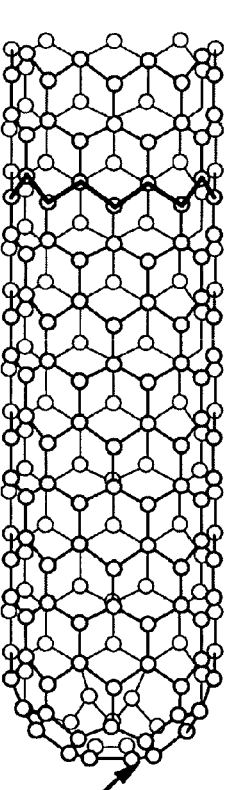
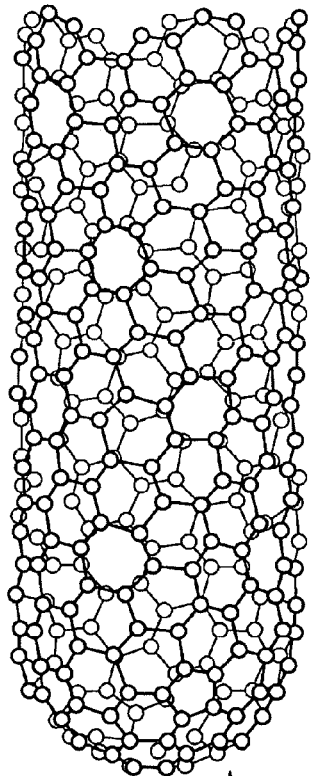

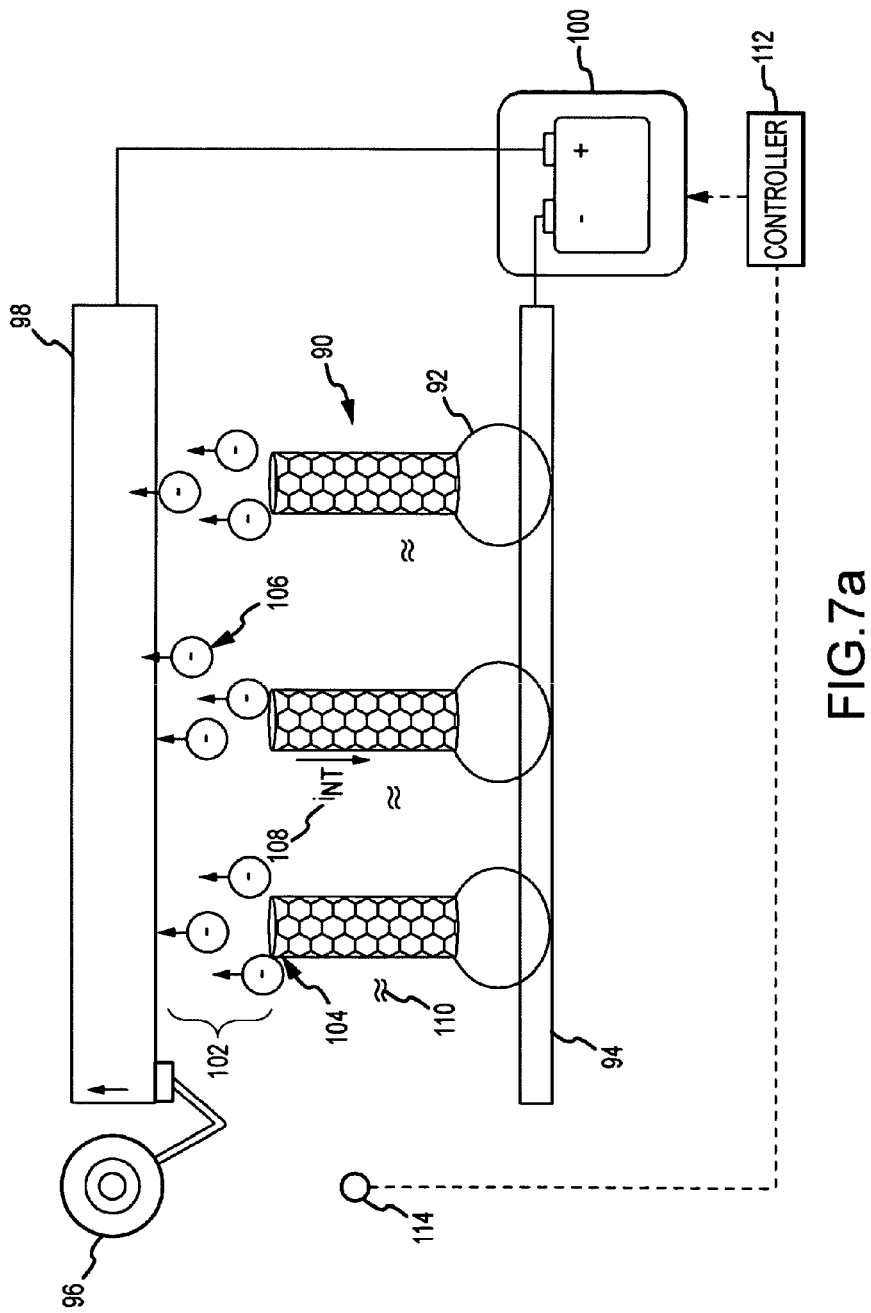

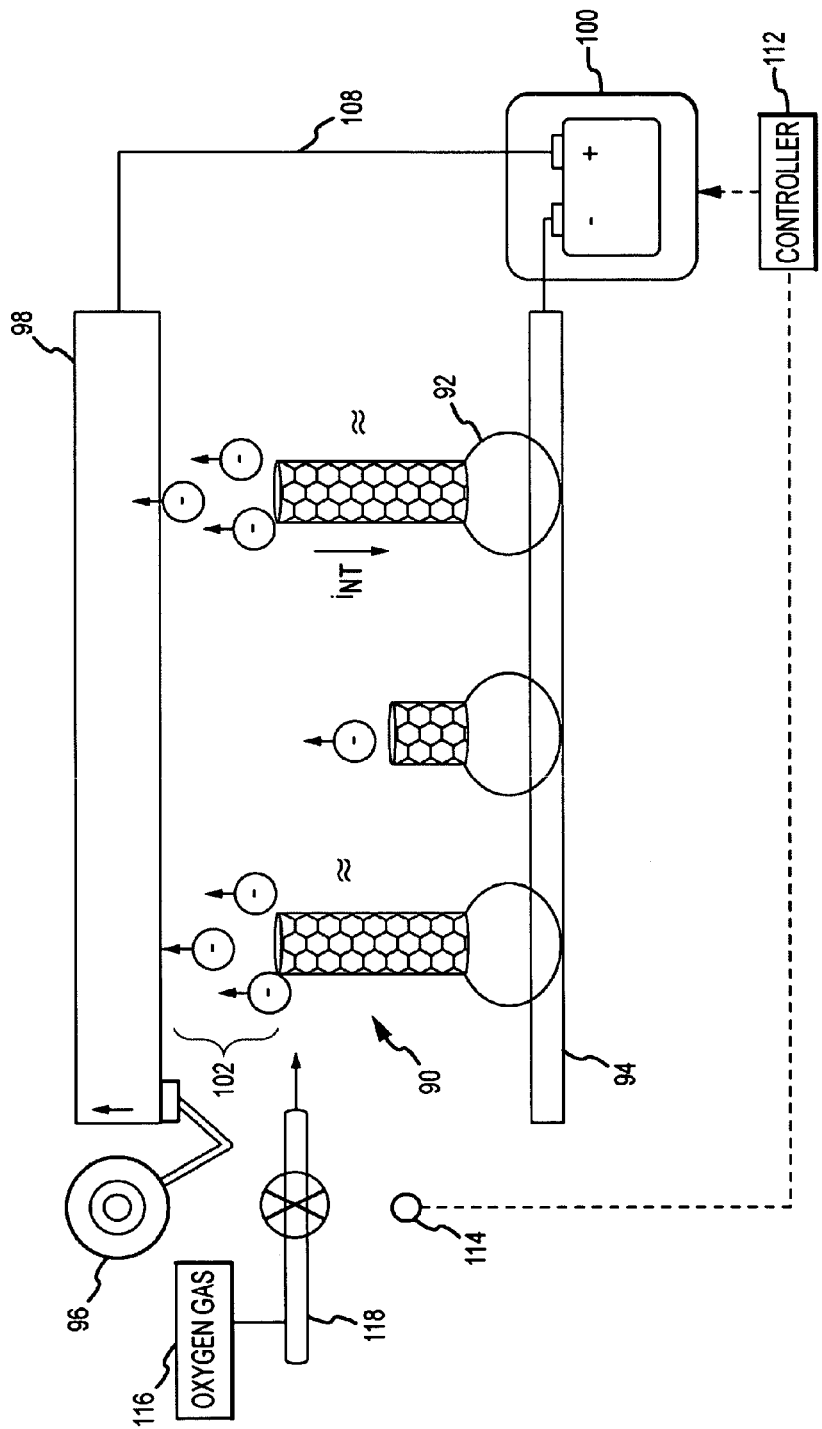

SYSTEM AND METHOD FOR LOW-POWER NANOTUBE GROWTH USING DIRECT RESISTIVE HEATING

BACKGROUND OF THE INVENTION

1. Field of the Invention

This invention relates to nanotube (NT) growth of Carbon and other materials such as Germanium, Boron, Boron-Nitride, Boron-Carbide, $B_iC_jN_k$, Silica and Silica-Carbide, and more particular to a low-power approach to growing nanotubes.

2. Description of the Related Art

Carbon nanotubes (CNTs) have stimulated a great deal of interest in the microelectronic and other industries because of their unique properties including tensile strengths above 35 GPa, elastic modulus reaching 1 TPa, higher thermal conductivity than diamond, ability to carry 1000× the current of copper, densities below 1.3 g/cm$^3$ and high chemical, thermal and radiation stability. CNTs have great promise for devices such as field effect transistors, field emission displays, single electron transistors in the microelectronic industry, and uses in other industries. Commercialization of CNTs will depend in large part on the ability to grow and network CNTs on a large cost-effective scale without compromising these properties.

As illustrated in FIG. 1, a CNT 10 is a hollow cylindrical shaped carbon molecule. The cylindrical structure is built from a hexagonal lattice of sp$^2$ bonded carbon atoms 12 with no dangling bonds. The properties of single-walled nanotubes (SWNTs) are determined by the graphene structure in which the carbon atoms are arranged to form the cylinder. Multi-walled nanotubes (MWNTs) are made of concentric cylinders around a common central hollow.

CNTs are commonly grown using several techniques such as arc discharge, laser ablation and chemical vapour deposition (CVD). In CVD the growth of a CNT is determined by the presence of a catalyst, usually a transition metal such as Fe, Co or Ni, which causes the catalytic dehydrogenation of hydrocarbons and consequently the formation of a CNT. CVD generally produces MWNTs or SWNTs of relatively poor quality due mostly to the poorly controlled diameters of the nanotubes. However, CVD is relatively easy to scale up and can be integrated with conventional microelectronic fabrication, which favors commercialization.

The way in which nanotubes are formed at the atomic scale is not precisely known. The growth mechanism is still a subject of scientific debate, and more than one mechanism might be operative during the formation of CNTs. As shown in FIGS. 2a and 2b, a catalyst 20 is deposited on a support such as silicon, zeolite, quartz, or inconel 22. At elevated temperatures, exposure to a carbon containing gas causes the catalyst to take in carbon, on either the surfaces, into the bulk, or both. This thermal diffusion process of neutral carbon atoms occurs at energies of a few electronvolts (eV). A precursor to the formation of nanotubes and fullerenes, $C_2$, is formed on the surface of the catalyst. From this precursor, a rodlike carbon 24 is formed rapidly, followed by a slow graphitization of its wall. The CNT can form either by 'extrusion' (also know as 'base growth' or 'root growth') shown in FIG. 2a, in which the CNT grows upwards from the catalyst that remains attached to the support, or the particles can detach from the substrate and move at the head of the growing nanotube, labelled 'tip-growth', as shown in FIG. 2b. Depending on the size of the catalyst particle either SWNT or MWNT are grown. A typical catalyst may contain an alloy of Fe, Co or Ni atoms having a total diameter of 1 to 100 nm (on the order of 1,000 atoms for 1 nm diameter of catalyst).

The application of thermal energy or heat is essential to stimulate the growth mechanism of CNTs. Heat is required to break the hydrocarbon molecules in the carbon containing gas upon colliding with the catalyst so they attach to the catalysts. Heat is required to transport these carbon atoms via diffusion processes to the interface of the catalyst and the carbon nanotubes to obtain higher growth rates. Heat is required for the CNT to attach the carbon atoms quickly for fast growth. The thermal energy must be controlled to provide sufficient heating to stimulate these growth processes without melting the catalyst of breaking the CNT. Typically heating is provided by induction, plasma discharge, substrate or wall heating. The power consumption required by these methods of indirect heating of the catalyst is a significant factor in the manufacturing cost.

As shown in FIG. 3, to synthesize CNTs 24 using CVD the support 22 and catalytic material 20 are placed inside an environmentally-controlled chamber 32. The sample is heated until the temperature is great enough (400° C.) that the introduction of hydrogen along with a buffer gas (Argon) "reduces" (removes the oxide) the particle. A plurality of gas feeds 34 introduce a process gas including a mixture of a carbon-containing growth gas 36, typically a hydrocarbon $C_xH_y$ such as Ethylene ($C_2H_4$), Methane ($CH_4$), Ethanol ($C_2H_5OH$), or Acetylene ($C_2H_2$) or possibly a non-hydrocarbon such as carbon-monoxide (CO), an inert buffer gas 38 such as Argon (Ar) to control pressure inside the chamber and prevent released hydrogen atoms from exploding and possibly a scrubber gas 40 such as $H_2O$ or $O_2$ to periodically or continuously clean the surface of the catalyst. An energy source 42 such as induction, plasma discharge, substrate or wall heating provides the energy necessary (e.g. a few eV) to heat the catalyst to a temperature which allows it to 'crack' the hydrocarbon molecules into reactive atomic carbon 44 upon colliding with the catalyst, to heat the catalyst to increase the transport of carbon to the catalysts/CNT interface and to heat the CNT itself. The reactive carbon 44 is absorbed into the surface of catalytic material 20 causing the CNT to grow from the same catalytic surface. A pump system 46 including a vacuum and/or pressure pump controls the pressure inside the chamber to produce conditions both conducive to absorption of carbon atoms into the catalytic material and growth of CNTs from the catalytic material. A number of electrical ports 48 are provided to accommodate pressure sensors, thermocouples and the like to monitor conditions inside the chamber.

As shown in FIGS. 4a and 4b, CVD can be used to synthesize an array of vertically aligned CNTs 50 between a Si substrate 52 and a metal thin-film 54, suitably nickel, via a lift-off process. The thin-film is formed over Fe particles 56 on substrate 52 that serve as catalysts. The CVD process initiates nanotube growth that 'lifts' thin-film 54 off of the substrate. The fabrication of three-dimensional networks of CNTs with controlled orientation will be essential for building large-scale function devices integrated with microelectronics circuits. Bingqing Wei et al. "Lift-up growth of aligned carbon nanotube patterns" Applied Physics Letters Volume 77, Number 19 6 Nov. 2000 and JacquelinMerikhi et al. "Sandwich growth of carbon nanotubes" Diamond & Related materials 15 (2006) pp. 104-106.

SUMMARY OF THE INVENTION

The present invention provides a low-power system and method for growing nanotubes out of carbon and other materials using a CVD, ion implantation or hybrid process with direct resistive heating of the nanotubes.

This is accomplished by providing a growth-initiated array of nanotubes in which the nanotubes and their respective catalysts are supported on a substrate. An electrical source is connected between the substrate and a plate over the nanotubes to cause electrical current to flow through and resistively heat the nanotubes and their catalysts. The process of nanotube growth continues using a CVD or ion implantation process through completion. The direct resistive heating of the nanotubes replaces or reduces the indirect heating typically used thereby improving heating efficiency and reducing overall power consumption. A sensed condition indicative of the temperature of the nanotubes is suitably fed back to control the electrical source to maintain a temperature within a desired range for optimal growth.

In an embodiment, opposite ends of the nanotubes are physically bonded to the substrate and the plate. The electrical source is a current source that supplies the electrical current to the nanotubes. The plate may be lifted by the growth of nanotubes. Alternately, a mechanical actuator can lift the plate. The actuator can be controlled to either match the growth rate or to exert a small pulling force on the nanotubes to increase the growth rate. If the nanotubes exhibit the same chirality they should grow at the same rate. Statistically some nanotubes will grow slower than others. Those nanotubes will exhibit a lower resistance and thus draw a higher proportion of the sourced current. This additional heating should further stimulate growth to keep the growth rate of the entire array fairly uniform. If the nanotubes exhibit different chiralities they will grow at different rates. The bonds of the slower growing nanotubes will likely break thereby producing an array of only nanotubes having one chirality with the fastest growth rate.

In another embodiment, a mechanical actuator maintains the plate at a small distance above the nanotubes. The electrical source is a voltage source, whereby application of a voltage across the gap between the free end of the nanotubes and the plate causes field emission to occur and electrical current to flow through the nanotubes. If the nanotubes exhibit the same chirality they should grow at the same rate. If the nanotubes exhibit different chiralities some of them will grow slower than the others. The actuator maintains the distance to the tallest fastest growing nanotubes. This increases the gap to the shorter nanotubes which reduces the amount of current to those nanotubes further slowing their growth. This approach can be used to filter the nanotubes by chirality, particularly the fastest growing nanotubes. To select a subset of nanotubes having a slower growth rate, the actuator may contact the plate to the tallest nanotubes in an oxygen environment to burn up the nanotubes. The actuator then maintains the plate at a distance above another subset of nanotubes having a chirality that exhibits the highest growth rate among the remaining nanotubes.

In another embodiment, a conventional hot CVD process is used to form the growth-initiated array of nanotubes. Once direct resistive heating of the nanotubes is initiated the CVD process is run cold to improve energy efficiency. The CVD process can be configured with a single feedstock/growth chamber as per convention or the substrate can be used to separate the chamber into a feedstock chamber on one side and a growth chamber on the other. The latter approach separates nanotube growth from the noxious feedstock gases which tend to deteriorate the catalyst with byproducts over time.

In another embodiment, an ion implantation process is used to form the growth-initiated array of nanotubes. The requisite heating can be provided indirectly by wall or substrate heating or by the energy in the ion beam itself. Once direct resistive heating of the nanotubes is initiated the indirect heat source can be removed or reduced (reduced beam energy) to improve energy efficiency. The ion implantation process can be configured with a single implantation/growth chamber or the substrate can be configured to provide an implantation region on one side and a growth region on the other. The two chambers may be held in the same vacuum or the substrate may provide an environmental seal for independent control. This approach separates nanotube growth from the ion beam.

In another embodiment, a hybrid CVD and ion implantation process is used. The substrate forms a seal creating two separate chambers. A feedstock/growth chamber is formed on one side of the substrate and an implantation chamber on the other side of the substrate. A CVD process initiates growth of the nanotube array. Current is passed through the nanotubes to provide the direct resistive heating. At this point, either the CVD process can be run cold for awhile before switching to the ion implantation process or the ion implantation process can start immediately. The hybrid approach combines the fast growth capability of the CVD process to initiate growth with the sustained growth capability of ion implantation to grow nanotubes of arbitrary length.

These and other features and advantages of the invention will be apparent to those skilled in the art from the following detailed description of preferred embodiments, taken together with the accompanying drawings, in which:

BRIEF DESCRIPTION OF THE DRAWINGS

FIG. 1, as described above, is a diagram of a carbon nanotube;

FIGS. 2a-2b, as described above, are diagrams illustrating root and tip CNT growth;

FIGS. 6a through 6c are diagrams of carbon nanotubes illustrating armchair, zig-zag and chiral orientations, respectively;

FIGS. 7a and 7b are diagrams of a voltage source connected between a growth-initiated CNT array and a plate to stimulate field emission to provide direct resistive heating of the nanotubes and their catalysts for single and multiple chirality growth, respectively;

DETAILED DESCRIPTION OF THE INVENTION

The present invention provides a low-power system and method for growing nanotubes out of carbon and other materials such as Germanium, Boron, Boron-Nitride, Boron-Carbide, $B_iC_jN_k$ where i, j and k are any non-negative integers, Silicon and Silicon-Carbide using a CVD, ion implantation or hybrid process with direct resistive heating of the nanotubes. This is accomplished by providing a growth-initiated array of nanotubes. An electrical source is connected between the substrate and a plate over the nanotubes (in contact with or separated by a small gap) to cause electrical current to flow through the nanotubes producing direct resistive heating of the nanotubes and their catalysts. The process of nanotube growth continues using a CVD or ion implantation process through completion. The direct resistive heating of the nanotubes replaces or reduces the indirect heating typically used thereby improving heating efficiency and reducing overall power consumption. A sensed condition indicative of the temperature of the nanotubes is suitably fed back to control the electrical source to maintain a temperature within a desired range for optimal growth.

Figure 3:
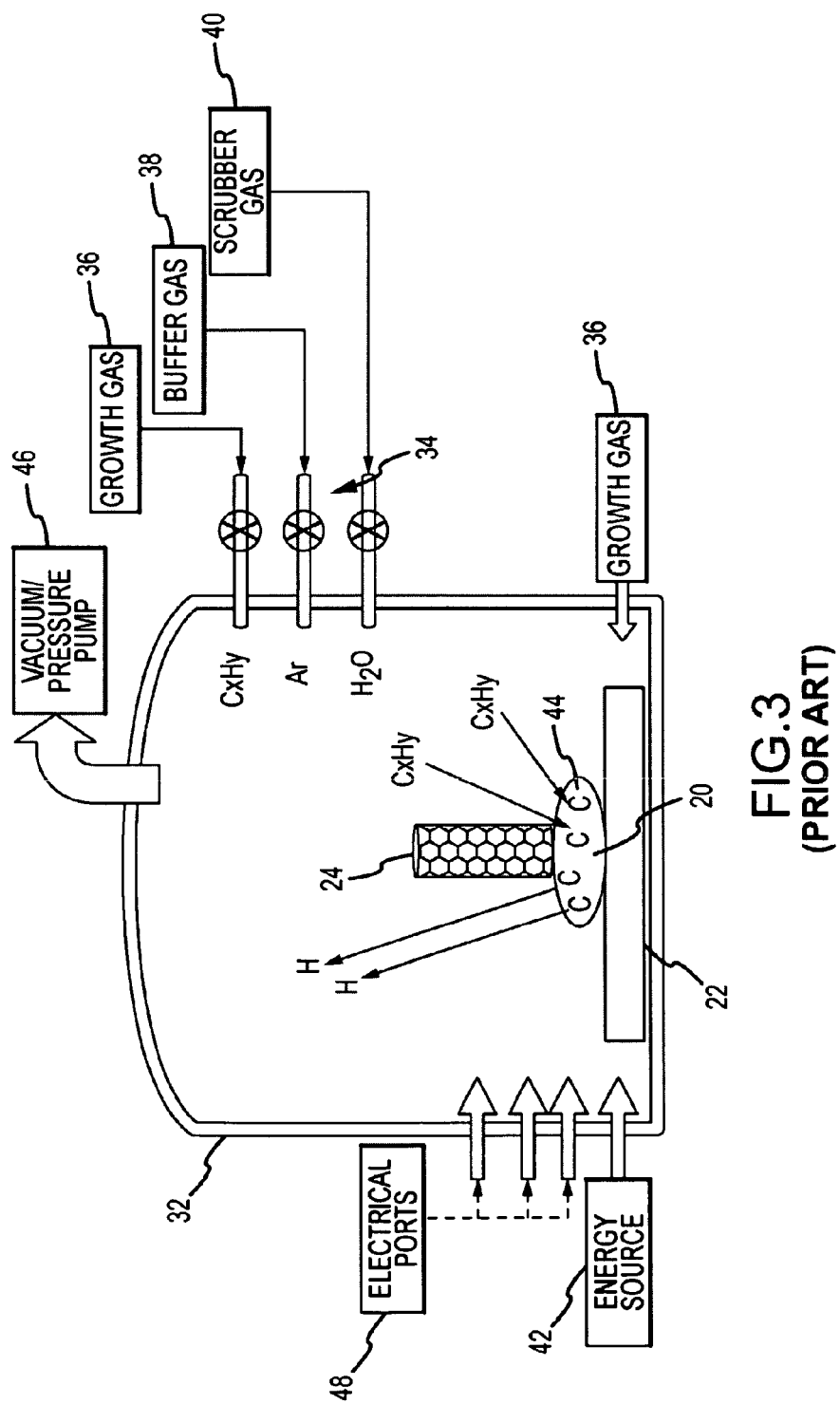
FIG. 3, as described above, is a diagram of a conventional CVD process using a single feedstock-growth chamber to grow CNTs on a substrate.
Figure 4A:
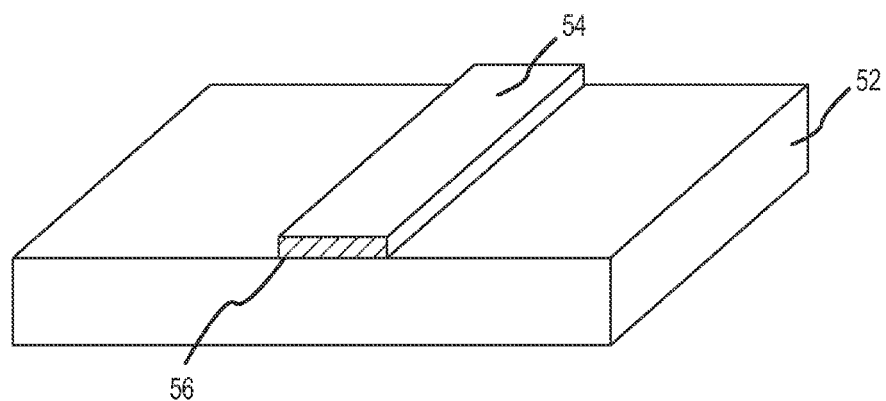
FIGS. 4a and 4b, as described above, are diagrams of a CVD "lift-off" process for growing an array of CNTs that lifts a metal thin-film.
Figure 4B:
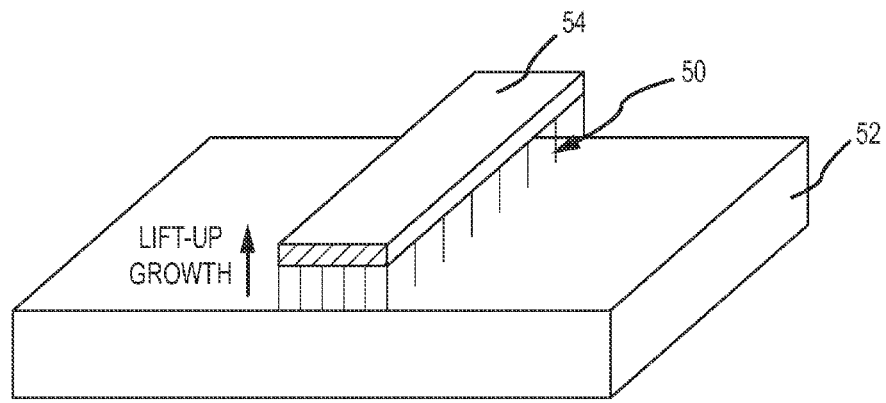
Figure 5A:
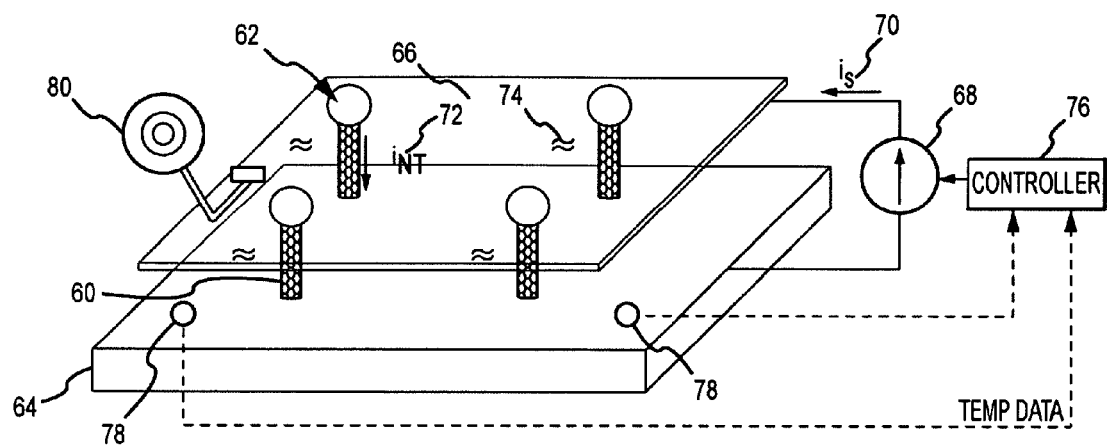
FIGS. 5a and 5b are physical and electrical schematic diagrams of a current source connected across a growth-initiated CNT array to provide direct resistive heating of the nanotubes and their respective catalysts.
Figure 5B:
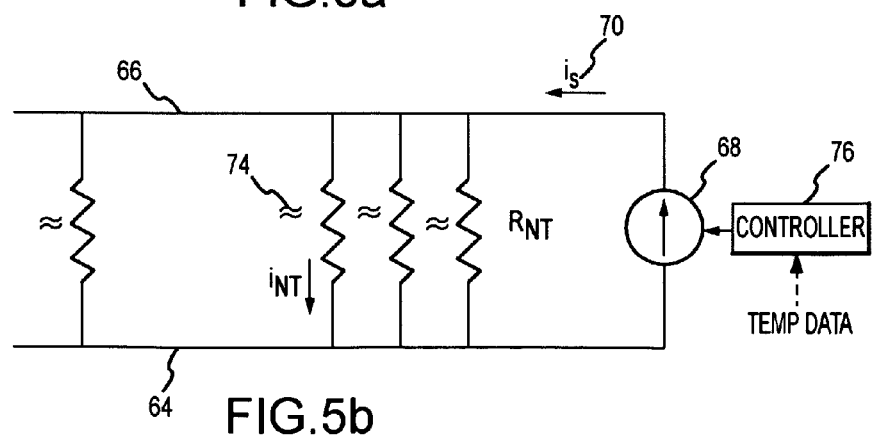

As shown in FIGS. 5a and 5b, some process such as CVD or ion implantation is used to provide a growth-initiated array of nanotubes 60 in which the nanotubes and their respective catalysts 62 are supported between and bonded to a substrate 64 and a plate 66. Plate 66 is suitably a metal thin-film such as nickel provided via a lift-off process. In this embodiment, the nanotubes are grown via 'tip growth'. The nanotubes may be alternately grown via 'root growth' or both. Either growth process uses some type of indirect heating to heat the catalysts to initiate nanotube growth. Indirect heating is an inefficient approach to heating the catalysts because much energy is expended to heat the environment inside the chamber, substrate, chamber walls etc. However, it is needed to initiate nanotube growth.

To reduce the go-forward, hence total power consumption, a current source 68 is connected across the substrate 64 and thin-film 66, which are configured to provide electrical contacts at opposite ends of the nanotubes, to close an electrical circuit. The substrate and thin-film typically conduct electrical current. Alternately, conductive traces or paths could be formed in either or both if non-conductive. The current source sources electrical current $i_S$ 70 that flows through the nanotubes as $i_{NT}$ 72 producing direct resistive heating 74 of the nanotubes and their catalysts (and the nearby surrounding gas in a CVD process). A controller 76 suitably controls the amount of current $i_S$ 70 to maintain the nanotube temperature in a desired range for optimal growth. Typical ranges for carbon nanotube growth are 400 to 1000 degrees Celsius. Closer tolerances in temperature may be required in certain process controls. The initial current is set based on a calculation or empirical evidence of the estimated number of nanotubes and average resistance. The control may operate open-loop depending on the temperature tolerances.

Alternately, one or more sensors 78 suitably sense a condition indicative of the temperature of the nanotubes that is fed back to the controller 76 to control the current source to maintain the temperature within the desired range. The sensed condition may be the temperature of the nanotubes or another parameter correlated to temperature. In one embodiment, an optical pyrometer outside the chamber is used to directly sense the temperature inside the chamber. An optical pyrometer generally senses the maximum temperature in an imaged area. The thin-film may be lifted by the growth of nanotubes. Alternately, a mechanical actuator 80 such as a piezo actuator can lift the thin-film 66. The actuator can be controlled to either match the growth rate or to exert a small pulling force on the nanotubes to place them under tensile stress and increase the growth rate. The process of nanotube growth continues using a growth process such as CVD or ion implantation through completion. The direct resistive heating of the nanotubes replaces or reduces the indirect heating typically used thereby improving heating efficiency and reducing overall power consumption.

As mentioned above, the carbon nanotubes 60 grow as a hollow cylindrical shaped carbon molecule built from a hexagonal lattice of $sp^2$ bonded carbon atoms with no dangling bonds. As shown in FIGS. 6a through 6c, the orientation of the hexagonal lattice can exhibit different 'chirality' e.g. armchair 82, zig-zag 84, and chiral 86. The different chiralities exhibit different electrical and thermal conductivities and different growth rates. Typically, the array of carbon nanotubes will exhibit different chiralities somewhat randomly across the array. The bonds of the slower growing nanotubes will likely break (the CNT being much stronger than the bond between the CNT and substrate or thin-film) thereby producing an array of only nanotubes having one chirality with the fastest growth rate. If the growth process can be controlled so that all nanotubes exhibit the same chirality they should grow at the same rate. Statistically some nanotubes will grow slower than others even if they are the same chirality. Those nanotubes will exhibit a lower resistance $R_{NT}$ and thus draw a higher proportion of the sourced current. This additional heating should further stimulate growth to keep the growth rate of the entire array fairly uniform for one chirality. A system and method for growing carbon nanotube arrays of one chirality is disclosed in co-pending U.S. application Ser. No. 12/174,356 entitled "Epitaxial Growth and Cloning of a Precursor Chiral Nanotube" filed on Jul. 16, 2008 now U.S. Pat. No. 8,038,795, the contents of which are incorporated by reference.

As shown in FIG. 7a, a process such as CVD or ion implantation is used to provide a growth-initiated array of nanotubes 90 in which the nanotubes 90 and their respective catalysts 92 are supported on a substrate 94. In this embodiment, the nanotubes are grown via 'root growth'. The nanotubes may be alternately grown via 'tip growth' or both. Either growth process uses some type of indirect heating to heat the catalysts to initiate nanotube growth. Indirect heating is an inefficient approach to heating the catalysts because much energy is expended to heat the environment inside the chamber, substrate, chamber walls etc. However, it is needed to initiate nanotube growth.

Once nanotube growth is initiated, the array is heated using direct resistive heating. A mechanical actuator 96 maintains a plate 98 at a small distance above the nanotubes. A voltage source 100 connected across the substrate 94 and plate 98 applies a voltage across a gap 102 between the free end 104 of the nanotubes 90 and the plate 98 causing field emission of electrons 106 to occur and electrical current $i_{NT}$ 108 to flow through the nanotubes 90 producing direct resistive heating 110 of the nanotubes and their catalysts (and the surrounding gas in a CVD process). A controller 112 controls the voltage level and/or the actuator 96 controls the gap to adjust the current level to maintain the nanotube temperature in a desired range for optimal growth. The initial voltage is set based on a calculation or empirical evidence of the estimated number of nanotubes and average resistance. The controller may simply fix the voltage level or vary it based on calculations or empirical evidence. Alternately, one or more sensors 114 suitably sense a condition indicative of the temperature of the nanotubes, which is fed back to the controller 112 to control the voltage source and/or mechanical actuator to maintain the temperature within the desired range. The sensed condition may be the temperature of the nanotubes or another parameter correlated to temperature. The process of nanotube growth continues using a CVD or ion implantation process through completion. The direct resistive heating of the nanotubes replaces or reduces the indirect heating typically used to improve heating efficiency and reduce overall power consumption.

As mentioned above, the carbon nanotubes may exhibit different chiralities. If, as depicted in FIG. 7a, the nanotubes 90 exhibit the same chirality they should grow at the same rate. If, as depicted in FIG. 7b, the nanotubes 90 exhibit different chiralities some of them will grow slower than the others. The actuator 96 maintains the distance to the tallest fastest growing nanotubes. This increases the gap to the shorter nanotubes which reduces the amount of current to those nanotubes further slowing their growth. If the gap is large enough field emission, hence current flow will cease. This approach can be used to filter the nanotubes by chirality, particularly the fastest growing nanotubes. To select a subset of nanotubes having a slower growth rate, oxygen gas 116 is fed into the chamber via line 118 and the actuator contacts the plate to the tallest nanotubes to burn up the nanotubes. The oxygen is pumped out of the chamber and actuator then maintains the plate at a distance above another subset of nanotubes having a chirality that exhibits the highest growth rate among the remaining nanotubes.

Direct resistive heating to grow nanotubes out of carbon and other materials can be implemented with, for example, CVD, ion implantation or hybrid growth processes. Both the current and voltage source embodiments can be used with any of these or other growth processes. By way of example only, each of these growth processes will be described in context of the current source embodiment.

Direct Resistive Heating in CVD Processes

A conventional hot CVD process can be used to form the growth-initiated array of nanotubes. Once direct resistive heating of the nanotubes is initiated the CVD process is run cold to improve energy efficiency. The CVD process can be configured with a single feedstock/growth chamber as per convention (FIG. 8) or the substrate can be configured with catalyst material embedded therein that provides a feedstock chamber on one side and a growth chamber on the other (FIG. 9). The latter approach separates nanotube growth from the noxious feedstock gases. The latter approach is detailed in co-pending U.S. application Ser. No. 11/969,533 entitled "Carbon Nanotube Growth via Chemical Vapor Deposition using a Catalytic Transmembrane to Separate Feedstock and Growth Chambers" filed on Jan. 4, 2008, the contents of which are incorporated by reference.

Figure 8:
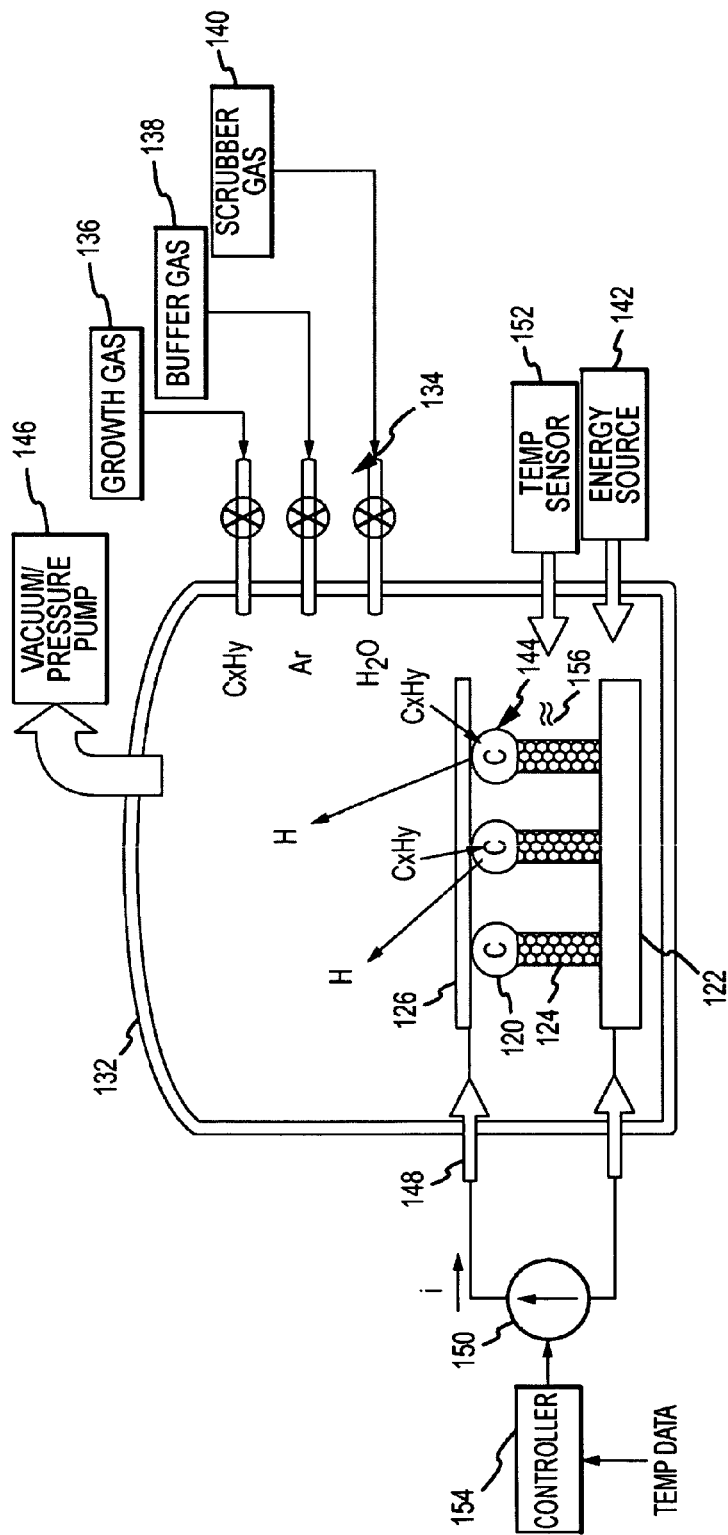
FIG. 8 is a diagram of a feedstock/growth chamber for a low-power CVD process.
Figure 9:
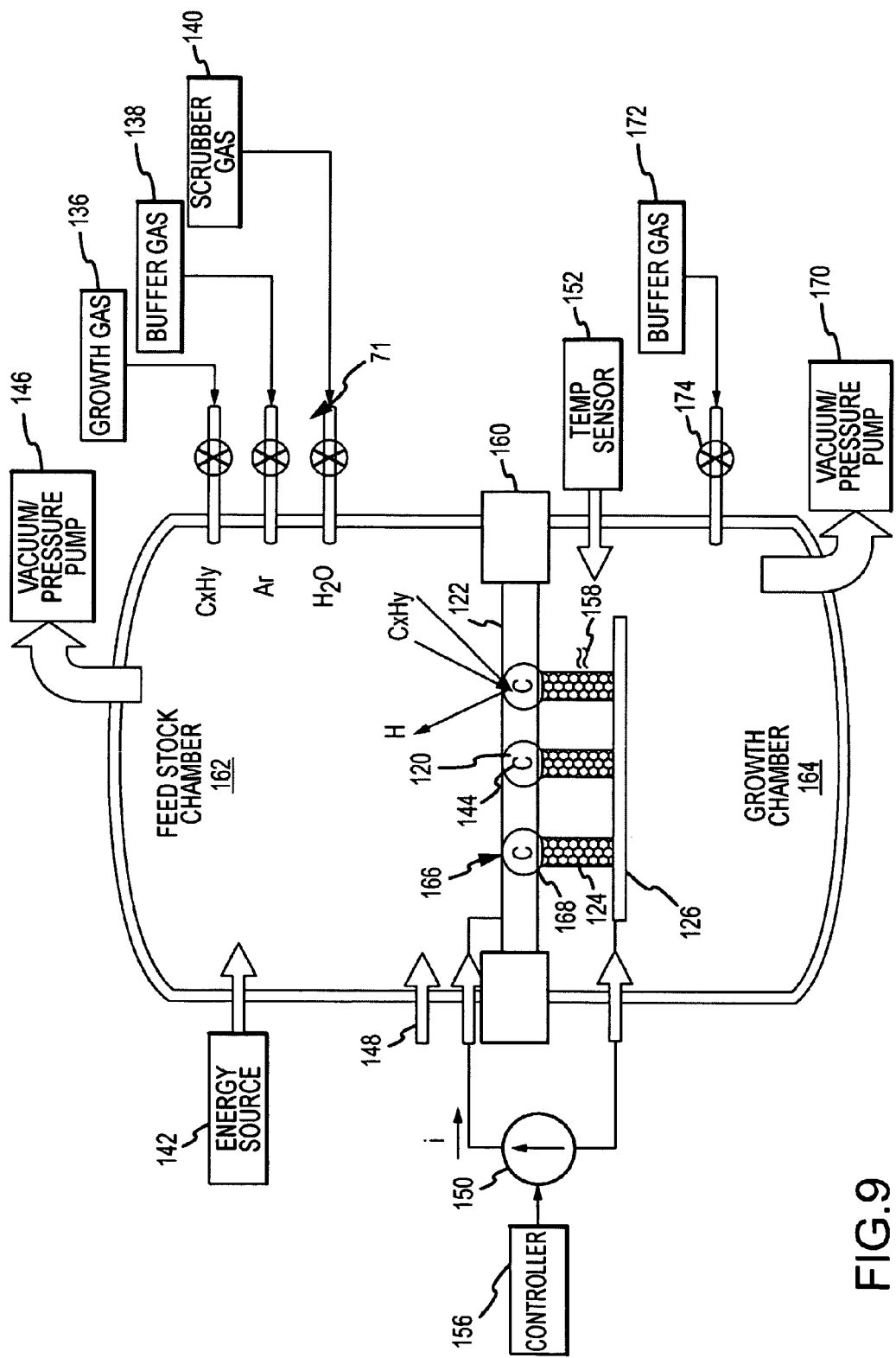
FIG. 9 is a diagram of a low-power CVD process in which the substrate separates the feedstock and growth chambers.

As shown in FIG. 8, to synthesize CNTs 124 using CVD the substrate 122 and catalyst 120 with a thin-film 126 thereon are placed inside an environmentally controlled chamber 132. A plurality of gas feeds 134 introduce a process gas including a mixture of a carbon-containing growth gas 136, typically a hydrocarbon $C_xH_y$ such as Ethylene ($C_2H_4$), Methane ($CH_4$), Ethanol ($C_2H_5OH$), or Acetylene ($C_2H_2$) or possibly a non-hydrocarbon such as carbon-monoxide (CO), an inert buffer gas 138 such Argon (Ar) to control pressure inside the chamber and prevent released hydrogen atoms from exploding and possibly a scrubber gas 140 such as $H_2O$ or $O_2$ to periodically or continuously clean the surface of the catalyst. An energy source 142 such as induction, plasma discharge, substrate or wall heating provides the energy necessary (e.g. a few eV) for a hot CVD process to heat the catalyst to a temperature which allows it to 'crack' the hydrocarbon molecules into reactive atomic carbon 144, to heat the catalyst to increase the transport of carbon to the catalysts/CNT interface and to heat the CNT itself. The reactive carbon 144 is absorbed into the surface of catalyst 120 causing the CNT 124 to grow from the same catalytic surface and lift-thin film 126. A pump system 146 including a vacuum and/or pressure pump controls the pressure inside the chamber to produce conditions both conducive to absorption of carbon atoms into the catalytic material and growth of CNTs from the catalytic material. A number of ports 148 are provided to accommodate pressure sensors, thermocouples and the like to monitor conditions inside the chamber.

A direct resistive heating system includes a current source 150 that is electrically connected through ports 148 between substrate 122 and thin-film 126 to source current through the parallel-combination of nanotubes 124, a temperature sensor 152 such as an optical pyrometer that that senses the temperature of the nanotubes through a port 148 and a controller 154 that processes the temperature data to adjust the total source current to maintain the temperature in a desired range for optimal nanotube growth. Once growth is initiated, energy source 142 is suitably turned off and the heat required to crack the hydrocarbon molecules colliding with the catalyst, heat the catalyst for more rapid diffusion and to heat the CNT is provided by the direct resistive heating 156. The energy and power required to operate the current source is far less than the energy required to operate indirect energy source 142.

As shown in FIG. 9, direct resistive heating can also be used in conjunction with a modified CVD process in which the substrate 122 is secured by a gasket 160 to separate the chamber into a feedstock chamber 162 and a growth chamber 164 in which the growth-gas is confined to the feedstock chamber. The catalysts 120 are embedded in the substrate with portions 166 of catalyst surface exposed to the feedstock chamber for absorbing carbon atoms 144 from the growth gas and different portions of catalyst surface 168 exposed to the growth chamber to grow nanotubes 124 in an environment devoid of said growth gas. A vacuum or pressure pump 170 controls the pressure in the growth chamber. A buffer gas 172 may be fed into the chamber through lines 174 if desired. Substrate 122 is suitably quite thin, a few millimeters thick. Consequently the direct heating of the CNTs and catalysts in the growth chamber efficiently heats the gases in the feed stock chamber providing sufficient energy to 'crack' the hydrocarbon molecules which come into contact with the hot tubes and catalysts.

Direct Resistive Heating in Ion Implantation Processes

An ion implantation process can be used to form the growth-initiated array of nanotubes. Once direct resistive heating of the nanotubes is initiated the indirect heat source used to initiate growth is turned off or at least reduced to improve overall energy efficiency. The ion implantation process can be configured with a single implantation/growth chamber (FIG. 10) or the substrate can be configured with catalyst material embedded therein or thereon that provides an implantation region on one side and a growth region on the other (FIG. 11). The latter approach separates nanotube growth from the ion beam. The ion implantation approach is detailed in co-pending U.S. application Ser. No. 12/061,317 entitled "System and Method for Nanotube Growth via Ion Implantation using a Catalytic Transmembrane" filed on Apr. 2, 2008 now U.S. Pat. No. 7,883,580 the contents of which are incorporated by reference. Growth rates via direct implantation are expected to be considerably slower than CVD but sustainable and may be increased by indirect implantation via "knock on" or "sputtering" processes that amplify the number of carbon ions transferred into the catalyst. Ion implantation is a more precise and controllable process than CVD that facilitates closer spacing of CNTs in an array and control of CNT length.

Figure 10:
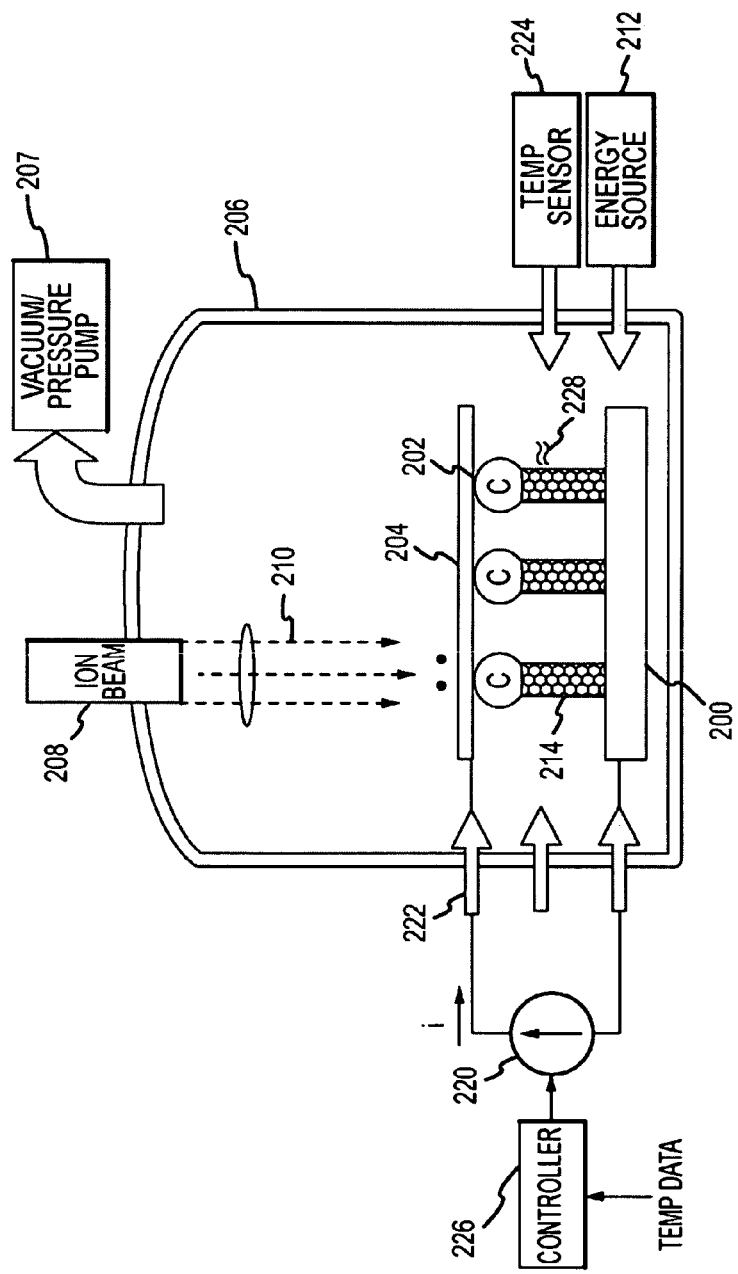
FIG. 10 is a diagram of an implantation/growth chamber for a low-power ion implantation process.
Figure 11:
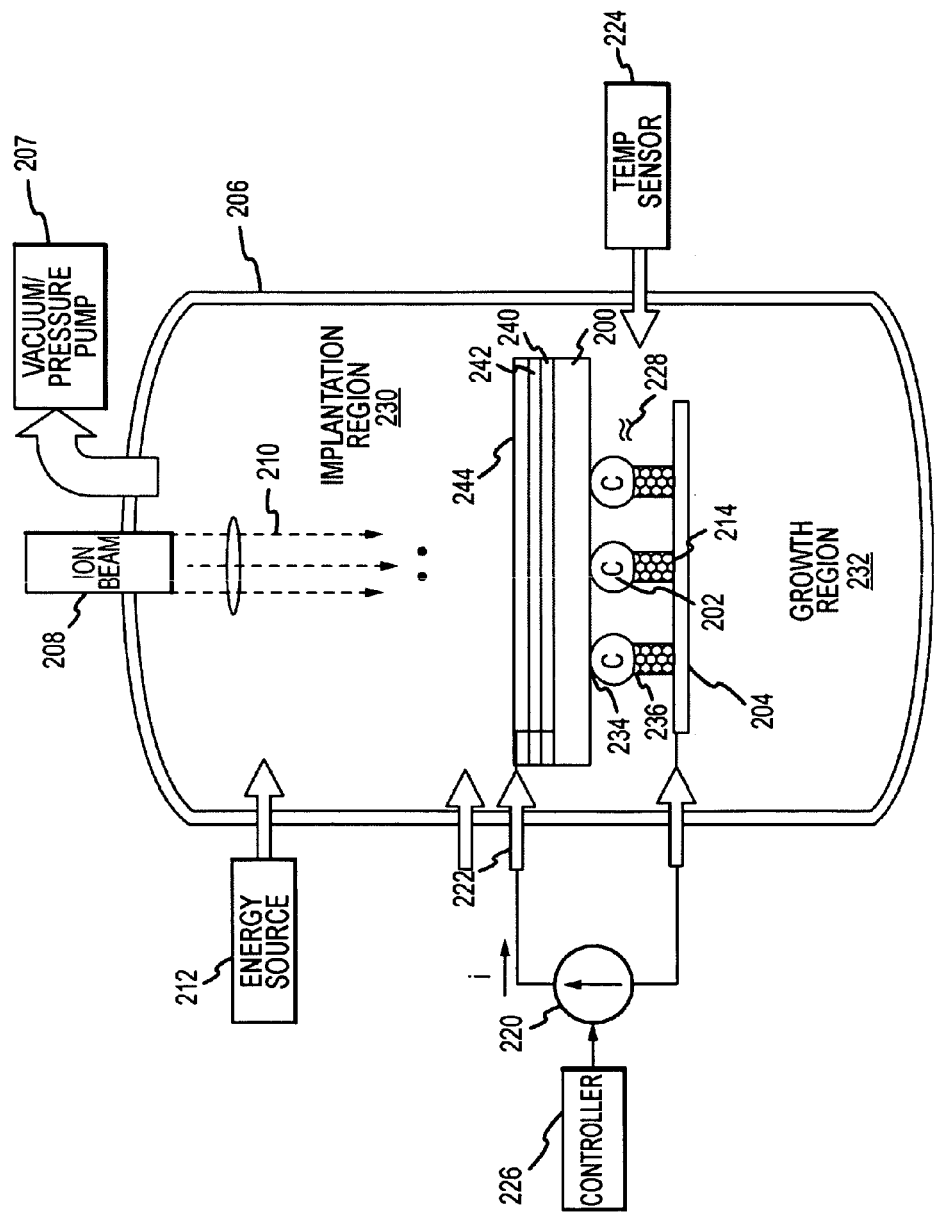
FIG. 11 is a diagram of a low-power ion implantation process in which the substrate separates implantation and growth regions.

As shown in FIG. 10, a substrate 200 having one or more catalysts 202 supported thereon and covered by a thin-film 204 is placed inside an environmentally controlled chamber 206 held at vacuum by a vacuum pump 207. A source 208 directs a beam of carbon ions 210 through the thin-film to implant the ions into the catalysts 202. The energy of the ion beam itself or an indirect energy source 212 provides the thermal energy necessary to heat the catalysts for proper diffusion and attachment of carbon atoms to initiate growth of CNTs 214.

A direct resistive heating system includes a current source 220 that is electrically connected through ports 222 between substrate 200 and thin-film 204 to source current through the parallel-combination of nanotubes 214, a temperature sensor 224 such as an optical pyrometer that that senses the temperature of the nanotubes through a port 222 and a controller 226 that processes the temperature data to adjust the total source current to maintain the temperature in a desired range for optimal nanotube growth. Once growth is initiated, energy source 212 is suitably turned off or reduced (e.g. if ion beam provides heating, reduce beam energy) and the heat required to heat the catalyst for more rapid diffusion and to heat the CNT is provided by the direct resistive heating 228. The energy and power required to operate the current source 220 is far less than the energy required to operate indirect energy source 212 and/or to operate the ion beam at higher energy levels.

As shown in FIG. 11, direct resistive heating can also be used in conjunction with a modified ion implant process in which substrate 200 physically separates chamber 206 into an implantation region 230 and a growth region 232. Catalysts 202 supported on the underside of substrate 200 (or embedded in the substrate) provide an implantation surface 234 to receive carbon ions from beam 210 with sufficient energy to reach, penetrate and stop in the catalyst and a growth surface 236 directly exposed to the growth region to grow carbon nanotubes 214. This configuration protects the CNTs from the ion beam. In addition, "knock-on" processes can be used to increase the flux of carbon ions implanted into the catalysts. A spacer layer 240 separates a knock on layer 242 (e.g. Graphite) from the catalyst material. An anti-sputtering layer 244 (e.g. Ti, Mo, etc.) is deposited over the knock-on layer. Source 208 directs ion beam 210 through the anti-sputtering layer onto knock-on layer 242. Through a "knock-on" process, each ion knocks multiple carbon ions forward through the substrate into catalyst 202 thereby providing gain. In this configuration, the source does not have to emit carbon ions, it could, for example, emit heavier ions to improve knock-on efficiency. In an alternate embodiment, a gasket is fitted around substrate 200 to isolate an implantation chamber from a growth chamber. Consequently, the pressure and gas environment of the growth chamber can be independently controlled as desired.

Direct Resistive Heating in a Hybrid CVD/Ion Implantation Process

Direct resistive heating can be similarly used in a hybrid CVD/ion implantation process. The substrate forms a seal creating two separate chambers. A feedstock/growth chamber is formed on one side of the substrate and an implantation chamber on the other side of the substrate. A CVD process initiates growth of the nanotube array. Current is passed through the nanotubes to provide the direct resistive heating. At this point, either the CVD process can be run cold for awhile before switching to the ion implantation process or the ion implantation process can start immediately. The hybrid approach combines the fast growth capability of the CVD process to initiate growth with the sustained growth capability of ion implantation to grow nanotubes of arbitrary length.

Figure 12:
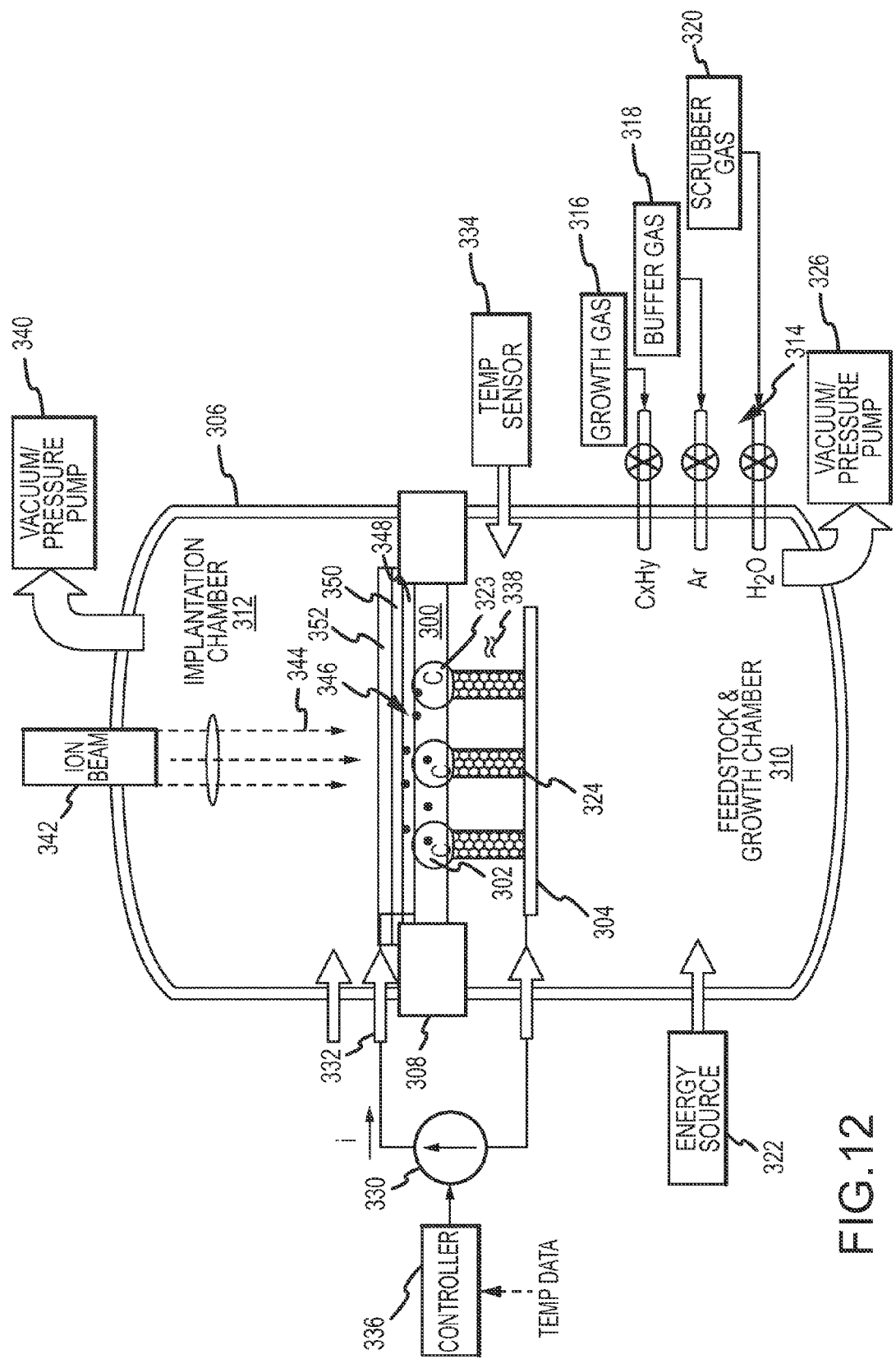
FIG. 12 is a diagram of a low-power hybrid CVD-ion implantation process in which the substrates isolates an implantation chamber from a feedstock/growth chamber.

As shown in FIG. 12, to initiate nanotube growth using CVD a substrate 300 with one or more catalysts 302 on the underside of the substrate or embedded therein and with a thin-film 304 over the catalysts is placed inside an environmentally controlled chamber 306. A gasket 308 holds the substrate 300 to form a seal that separates the chamber into a feedstock and growth chamber 310 for CVD and an implantation chamber 312 for ion implantation.

A plurality of gas feeds 314 introduce a process gas including a mixture of a carbon-containing growth gas 316, typically a hydrocarbon $C_xH_y$ such as Ethylene ($C_2H_4$), Methane ($CH_4$), Ethanol ($C_2H_5OH$), or Acetylene ($C_2H_2$) or possibly a non-hydrocarbon such as carbon-monoxide (CO), an inert buffer gas 318 such Argon (Ar) to control pressure inside the chamber and prevent released hydrogen atoms from exploding and possibly a scrubber gas 320 such as $H_2O$ or $O_2$ to periodically or continuously clean the surface of the catalyst. An energy source 322 such as induction, plasma discharge, substrate or wall heating provides the energy necessary (e.g. a few eV) for a hot CVD process to heat the catalyst to a temperature which allows it to 'crack' the hydrocarbon molecules into reactive atomic carbon 323, to heat the catalyst to increase the transport of carbon to the catalysts/CNT interface and to heat the CNT itself. The reactive carbon is absorbed into the exposed surface of catalyst 302 to initiate growth of CNT 324 to grow from the same catalytic surface and lift-thin film 304. A pump system 326 including a vacuum and/or pressure pump controls the pressure inside the chamber to produce conditions both conducive to absorption of carbon atoms into the catalyst and growth of CNTs from the catalyst.

A direct resistive heating system includes a current source 330 that is electrically connected through ports 332 between substrate 300 and thin-film 304 to source current through the parallel-combination of nanotubes 324, a temperature sensor 334 such as an optical pyrometer that that senses the temperature of the nanotubes through a port 332 and a controller 336 that processes the temperature data to adjust the total source current to maintain the temperature in a desired range for optimal nanotube growth. Once growth is initiated, energy source 332 is suitably turned off and the heat required to heat the catalyst for more rapid diffusion and to heat the CNT is provided by the direct resistive heating 338.

At this point, either the CVD process can be run cold for awhile before switching to the ion implantation process or the ion implantation process can start immediately. A vacuum pump 340 holds the implantation chamber 312 at vacuum. A source 342 directs a beam of ions 344 towards the substrate to cause carbon ions 346 to be implanted into catalyst 302. The beam may inject carbon ions directly into the catalysts or amplify them, as shown, using 'knock-on' processes. A spacer layer 348 separates a knock on layer 350 (e.g. Graphite) from the catalyst material. An anti-sputtering layer 352 (e.g. Ti, Mo, etc.) is deposited over the knock-on layer. Source 342 directs ion beam 244 through the anti-sputtering layer onto knock-on layer 350. Through a "knock-on" process, each ion knocks multiple carbon ions forward through the substrate into catalyst 302 thereby providing gain.

Figure 13:
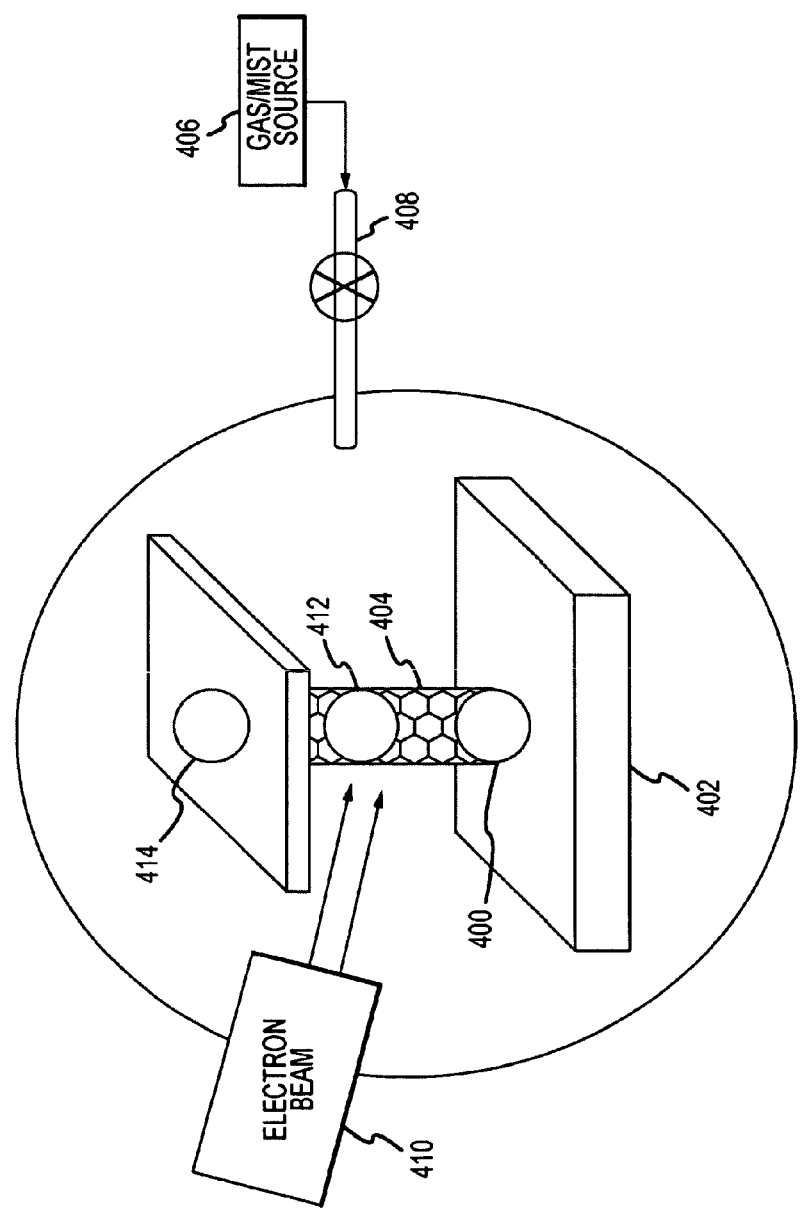
FIG. 13 is a diagram of a single nanotube in which a second catalyst has been formed within the nanotube.

Direct resistive heating is used to effectively and energy efficiently grow one or more nanotubes. In addition to proper and efficient heating, nanotube growth can be further stimulated by the formation of additional catalysts within the nanotubes as they grow. As shown in FIG. 13, root growth of a catalyst 400 on substrate 402 produces a nanotube 404. An element-containing gas or mist 406, for example, is introduced into the chamber environment through a gas feed 408. An electron beam 410 bombards the nanotubes in the element-containing environment to form an additional catalyst 412 at the tip of the growing nanotubes. In this embodiment, the tip is attached to a thin-film 414 to support the direct resistive heating. In the field emission embodiment, the tip may be unattached. The additional catalyst 412 may grow the nanotube via root or tip growth.

The process can be repeated for another catalyst 414 on the free end of the nanotube. This process for forming additional catalysts within the nanotubes to further stimulate and speed growth is not limited to direct resistive heating, the process can be used in any of the CVD or ion implantation processes with or without direct resistive heating.

Although the description of the invention has focused on the growth of carbon nanotubes the approach is viable for growing nanotubes from other materials such as Germanium (Ge), Boron (B), Boron-Nitride (BN), Boron-Carbide, $B_iC_jN_k$, Silicon (Si) or Silicon-Carbide (SiC). The interest in and development of carbon nanotube technology is well beyond that of other materials, hence the focus on carbon nanotubes. However, the approach of using direct resistive heating to grow nanotubes from these other or yet to be discovered materials is equally applicable.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. An apparatus for growing nanotubes from an element selected from among Carbon, Germanium, Boron, Boron-Nitride, Boron-Carbide, $B_iC_jN_k$, Silicon and Silicon-Carbide, comprising:
   a chamber;
   one or more growth-initiated nanotubes on a substrate inside the chamber, each nanotube including at least one catalyst;
   a plate over the one or more nanotubes;
   an electrical source connected between the substrate and plate causing electrical current to flow through and resistively heat the nanotubes and the catalysts; and
   a material source that supplies the heated catalyst with the selected element to sustain nanotube growth.

2. The apparatus of claim 1, further comprising:
   a sensor for sensing a condition indicative of the temperature of the heated nanotubes, said condition being fed back to control the amount of electrical current to maintain the temperature within a desired range.

3. The apparatus of claim 1, wherein the plate is physically bonded to the one or more nanotubes and said electrical source is a current source that supplies the electrical current.

4. The apparatus of claim 3, further comprising:
   an actuator that lifts the plate to place the nanotubes under tensile strength.

5. The apparatus of claim 1, wherein said electrical source is a voltage source, further comprising:
   an actuator that maintains the plate at a distance above the one or more nanotubes, said voltage source applies a voltage between the substrate and the plate that causes field emission to occur across a gap between the nanotubes and the plate and electrical current to flow through the nanotubes.

6. The apparatus of claim 5, wherein a plurality of said nanotubes are grown with different chiralities that exhibit different growth rates, said actuator maintaining the plate at the distance above a subset of said nanotubes of one chirality that exhibits the highest growth rate, field emission being reduced as the gap between the nanotubes that exhibit lower growth rates and the plate increases slowing and eventually stopping their growth to grow an array of nanotubes of the one chirality having the highest growth rate.

7. The apparatus of claim 5, wherein a plurality of said nanotubes are grown with different chiralities that exhibit different growth rates, further comprising a source of oxygen that can be selectively fed into the sealed chamber, said actuator bringing the plate in contact with a subset of said nanotubes of one chirality that exhibits the highest growth rate thereby sourcing sufficient current in an oxygen environment to burn up those nanotubes, said actuator maintaining the plate at a distance above another subset of said nanotubes of another chirality that exhibits the highest growth rate remaining.

8. The apparatus of claim 1, wherein the material source provides an element containing growth gas whereby element atoms are absorbed into the heated catalyst via a chemical vapor deposition process.

9. The apparatus of claim 1, wherein the material source implants element ions into the catalysts where the ions recombine with free electrons in element atoms.

10. The apparatus of claim 1, further comprising:
    a source of element-containing gas that can be selectively fed into the chamber; and
    an electron beam that bombards the nanotubes in the gas environment to form additional catalysts at the free end of the growing nanotubes.

11. An apparatus for growing nanotubes from an element selected from among Carbon, Germanium, Boron, Boron-Nitride, Boron-Carbide, $B_iC_jN_k$, Silicon and Silicon-Carbide, comprising:
    a chamber;
    a substrate in the chamber;
    one or more catalysts on the substrate;
    a plate over the catalysts;
    a growth-initiation system including,
       an energy source for indirectly heating the catalysts; and
       a first material source that supplies the heated catalysts with the selected element to initiate growth of an array of nanotubes from the catalysts, and
    a low-power growth system including,
       an electrical source connected between the substrate and plate to cause electrical current to flow through and resistively heat the one or more nanotubes; and
       a second material source that supplies the heated catalysts with the selected element to continue growth of the array of nanotubes.

12. The apparatus of claim 11, wherein the plate is physically bonded to the one or more nanotubes and said first source is a current source that supplies the electrical current.

13. The apparatus of claim 11, wherein said electrical source is a voltage source, further comprising:
an actuator that maintains the plate at a distance above the one or more nanotubes, said voltage source applies a voltage between the substrate and the plate causing field emission to occur across a gap between the nanotubes and the plate and electrical current to flow through the nanotubes.

14. The apparatus of claim 11, wherein said first and second material sources are the same said source for providing an element-containing growth gas whereby element atoms are absorbed into the catalysts and the nanotubes grown via a chemical vapor deposition process.

15. The apparatus of claim 14, wherein the substrate forms a seal that separates the chamber into a feedstock chamber and a growth chamber in which the growth-gas is confined to the feedstock chamber, said catalysts embedded in the substrate with portions of catalyst surface exposed to the feedstock chamber for absorbing element atoms from the growth gas and different portions of catalyst surface exposed to the growth chamber to grow nanotubes in an environment devoid of said growth gas.

16. The apparatus of claim 11, wherein said first and second material sources are the same said source for providing a beam of ions that cause element ions to be implanted into the catalysts where they recombine with free electrons to form element atoms.

17. The apparatus of claim 16, wherein the substrate separates the chamber into an implantation region and a growth region, each said catalyst having a first portion of catalyst surface towards the implantation region for receiving ions and a different second portion of catalyst surface directly exposed to the growth region on which the nanotubes are grown.

18. The apparatus of claim 17, wherein the source emits element ions that are directly implanted through the first portion of catalyst surface into the catalyst where they recombine with free electrons to form element atoms.

19. The apparatus of claim 17, wherein said substrate comprises an element containing layer between the catalysts and the implantation region and separated from the catalysts, said source emitting ions into said element-containing layer that releases a larger number of element ions that are implanted through the first portion of catalyst surface into the catalyst where they recombine with free electrons to form element atoms.

20. The apparatus of claim 11, wherein the substrate forms a seal that separates the chamber into an implantation region and a feedstock/growth region in which the gas compositions are independently controllable, each said catalyst having a first portion of catalyst surface towards the implantation region and a different second portion of catalyst surface directly exposed to the growth region, said first source provides an element-containing growth gas in said feedstock/growth chamber for absorbing element atoms into the second portion of the catalyst surfaces to initiate nanotube growth on the second portion of the catalyst surface via a chemical vapor deposition process, said second source provides a beam of ions that cause element ions to be implanted into the first portion of catalyst surfaces where they recombine with free electrons to form element atoms to sustain nanotube growth.

21. A method for low-power growth of nanotubes from an element selected from among Carbon, Germanium, Boron, Boron-Nitride, Boron-Carbide, BiCjNk, Silicon and Silicon-Carbide, comprising:
providing one or more growth-initiated nanotubes supported on a substrate, each nanotube including a catalyst;
positioning a plate over the one or more nanotubes;
connecting an electrical source between the substrate and plate to cause electrical current to flow through and resistively heat the nanotubes and the catalysts; and
supplying the heated catalysts with the selected element to continue growth of the array of nanotubes.

22. The method of claim 21, further comprising:
sensing a condition indicative of the temperature of the heated catalysts, and
feeding back the sensed condition to control the amount of electrical current to maintain the temperature within a desired range.

23. The method of claim 21, wherein the plate is bonded to the one or more nanotubes and said electrical source is a current source that supplies the electrical current.

24. The method of claim 23, further comprising:
growing a plurality of said nanotubes with different chiralities that exhibit different growth rates; and
breaking the bonds between the nanotubes having slower growth rates and the substrate as the plate is lifted by the nanotubes having faster growth rates.

25. The method of claim 21, wherein the electrical source is a voltage source that applies voltage between said substrate and plate, further comprising: maintaining the plate at a distance above the one or more nanotubes, where application of the voltage causes field emission to occur across a gap between a free end of the growing nanotubes and the plate and electrical current to flow through the nanotubes.

26. The method of claim 25, further comprising:
growing a plurality of said nanotubes with different chiralities that exhibit different growth rates; and
maintaining the plate at the distance above a subset of said nanotubes of one chirality that exhibits the highest growth rate so that field emission is reduced as the gap between the nanotubes that exhibit lower growth rates and the plate increases, slowing and eventually stopping their growth.

27. The method of claim 25, further comprising:
growing a plurality of said nanotubes with different chiralities that exhibit different growth rates;
introducing oxygen into the chamber;
bringing the plate in contact with a subset of said nanotubes of one chirality that exhibits the highest growth rate thereby sourcing current in an oxygen environment to burn up those nanotubes; and
maintaining the plate at a distance above another subset of said nanotubes of another chirality that exhibits the highest growth rate remaining.

28. The method of claim 21, wherein the step of providing the growth-initiated array comprises:
providing the substrate with the catalysts; and
initiating nanotube growth using a hot chemical vapor deposition process, wherein once direct resistive heating of the nanotubes has commenced, nanotube growth continues by supplying the selected elements using a cold chemical vapor deposition process.

29. The method of claim 21, wherein the steps of providing the growth-initiated array and continuing growth comprise:
providing the substrate with the catalysts;
providing a source of energy to indirectly heat the catalysts for initiating growth; and
directing a beam of ions that cause element ions to be implanted into the catalysts to initiate nanotube growth to lift the thin-film;
wherein once direct resistive heating of the nanotubes has commenced, at least reducing the source of energy that indirectly heats the catalysts and directing the beam of ions to continue nanotube growth.

30. The method of claim 21, wherein the steps of providing the growth-initiated array and continuing growth comprise:
providing the substrate with the catalysts;
forming a seal around the substrate that separates the chamber into a feedstock/growth chamber and an implantation chamber in which the gas compositions are independently controllable, each said catalyst having a first portion of catalyst surface towards the implantation region and a different second portion of catalyst surface directly exposed to the growth region;
providing a source of energy to indirectly heat the catalysts for initiating growth; and
introducing a growth-gas into the feedstock/growth chamber for absorbing element atoms into the second portion of the heated catalyst surfaces to initiate nanotube growth thereon via a chemical vapor deposition process; and
wherein once direct resistive heating of the nanotubes has commenced, at least reducing the source of energy that indirectly heats the catalysts and directing a beam of ions through the implantation chamber that cause element ions to be implanted through the first portion of catalyst surfaces to continue nanotube growth.

* * * * *